United States Patent
Dupuis

(10) Patent No.: US 7,145,396 B2
(45) Date of Patent: *Dec. 5, 2006

(54) METHOD AND APPARATUS FOR PROTECTING DEVICES IN AN RF POWER AMPLIFIER

(75) Inventor: Timothy J. Dupuis, Austin, TX (US)

(73) Assignee: Silicon Laboratories, Inc., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 10/673,750

(22) Filed: Sep. 29, 2003

(65) Prior Publication Data

US 2004/0070457 A1 Apr. 15, 2004

(51) Int. Cl.
*G06F 1/04* (2006.01)
*H03K 1/00* (2006.01)

(52) U.S. Cl. .................. 330/298; 330/207 P; 330/278; 330/279; 330/285

(58) Field of Classification Search ................ 330/298, 330/207 P, 278, 279, 285
See application file for complete search history.

(56) References Cited

U.S. PATENT DOCUMENTS

| | | | |
|---|---|---|---|
| 3,900,823 A | 8/1975 | Sokal et al. | |
| 4,021,751 A | 5/1977 | Suzuki | |
| 4,032,853 A * | 6/1977 | Hibbs, Jr. ................. | 330/2 |
| 4,075,574 A | 2/1978 | Gilbert | |
| 4,122,400 A * | 10/1978 | Medendorp et al. ...... | 330/207 P |
| 4,165,493 A | 8/1979 | Harrington | |
| 4,590,436 A | 5/1986 | Butler et al. | |
| 4,604,532 A | 8/1986 | Gilbert | |
| 4,649,467 A | 3/1987 | Vesce et al. | |
| 4,772,856 A | 9/1988 | Nojima et al. | |
| 4,808,907 A | 2/1989 | Main | |
| 4,857,865 A | 8/1989 | Berman et al. | |
| 4,893,030 A | 1/1990 | Shearer et al. | |
| 4,990,803 A | 2/1991 | Gilbert | |
| 5,023,566 A | 6/1991 | El-Hamamsy et al. | |
| 5,118,997 A | 6/1992 | El-Hamamsy et al. | |
| 5,274,341 A | 12/1993 | Sekine et al. | |
| 5,291,123 A | 3/1994 | Brown | |
| 5,298,811 A | 3/1994 | Gilbert | |
| 5,327,337 A | 7/1994 | Cripe | |
| 5,343,162 A | 8/1994 | Davis | |
| 5,345,185 A | 9/1994 | Gilbert | |
| 5,420,537 A | 5/1995 | Weedon et al. | |
| 5,434,537 A | 7/1995 | Kukkonen | |
| 5,450,036 A | 9/1995 | Nishioka et al. | |
| 5,477,188 A | 12/1995 | Chawla et al. | |

(Continued)

FOREIGN PATENT DOCUMENTS

DE 4419318 7/1995

(Continued)

OTHER PUBLICATIONS

Scuderi et al. "A high performance RF power amplifier with protection against load mismatches" IEEE Microwave Symposium Digest vol. 2, Jun. 8-13, 2003 pp. 699-702.*

(Continued)

*Primary Examiner*—Michael B Shingleton
(74) *Attorney, Agent, or Firm*—Johnson & Associates

(57) ABSTRACT

A method and apparatus are provided for use with a power amplifier for protecting active devices on the power amplifier. A peak detector is used by control circuitry to detect the presence of a peak voltage that exceeds a threshold voltage. In response to the detection of a peak voltage, the gain of the power amplifier is reduced.

23 Claims, 2 Drawing Sheets

U.S. PATENT DOCUMENTS

| | | | |
|---|---|---|---|
| 5,510,753 A * | 4/1996 | French | 330/146 |
| 5,604,383 A | 2/1997 | Matsuzaki | |
| 5,612,647 A | 3/1997 | Malec | |
| 5,623,231 A | 4/1997 | Mohwinkel et al. | |
| 5,625,205 A | 4/1997 | Kusama | |
| 5,635,872 A | 6/1997 | Zimmerman | |
| 5,646,578 A | 7/1997 | Loh et al. | |
| 5,648,743 A | 7/1997 | Nagaya et al. | |
| 5,726,603 A | 3/1998 | Chawla et al. | |
| 5,742,205 A | 4/1998 | Cowen et al. | |
| 5,831,331 A | 11/1998 | Lee | |
| 5,834,978 A | 11/1998 | Cho | |
| 5,867,061 A | 2/1999 | Rabjohn et al. | |
| 5,880,635 A | 3/1999 | Satoh | |
| 5,942,946 A | 8/1999 | Su et al. | |
| 5,955,926 A | 9/1999 | Uda et al. | |
| 5,969,582 A | 10/1999 | Boesch et al. | |
| 5,973,368 A | 10/1999 | Pearce et al. | |
| 5,974,041 A | 10/1999 | Kornfeld et al. | |
| 5,986,500 A | 11/1999 | Park et al. | |
| 6,008,698 A | 12/1999 | Dacus et al. | |
| 6,011,438 A | 1/2000 | Kakuta et al. | |
| 6,016,075 A | 1/2000 | Hamo | |
| 6,047,167 A | 4/2000 | Yamashita | |
| 6,047,168 A | 4/2000 | Carlsson | |
| 6,069,528 A * | 5/2000 | Kashima | 330/53 |
| 6,133,793 A | 10/2000 | Lau et al. | |
| 6,137,273 A | 10/2000 | Bales et al. | |
| 6,147,511 A | 11/2000 | Patel et al. | |
| 6,157,258 A | 12/2000 | Adishian et al. | |
| 6,167,134 A | 12/2000 | Scott et al. | |
| 6,181,207 B1 | 1/2001 | Chevallier et al. | |
| 6,198,347 B1 | 3/2001 | Sander et al. | |
| 6,203,516 B1 | 3/2001 | Kepley | |
| 6,208,549 B1 | 3/2001 | Rao et al. | |
| 6,208,875 B1 | 3/2001 | Damgaard et al. | |
| 6,222,788 B1 | 4/2001 | Forbes et al. | |
| 6,232,634 B1 | 5/2001 | Wu et al. | |
| 6,265,939 B1 | 7/2001 | Wan et al. | |
| 6,274,937 B1 | 8/2001 | Ahn et al. | |
| 6,319,829 B1 | 11/2001 | Pasco et al. | |
| 6,323,735 B1 | 11/2001 | Welland et al. | |
| 6,362,606 B1 | 3/2002 | Dupuis et al. | |
| 6,384,540 B1 | 5/2002 | Porter, Jr. et al. | |
| 6,392,488 B1 | 5/2002 | Dupuis et al. | |
| 6,407,639 B1 | 6/2002 | Jean et al. | |
| 6,448,847 B1 | 9/2002 | Paul et al. | |
| 6,462,620 B1 | 10/2002 | Dupuis et al. | |
| 6,492,872 B1 | 12/2002 | Fujioka et al. | |
| 6,525,611 B1 * | 2/2003 | Dening et al. | 330/207 P |
| 6,549,071 B1 | 4/2003 | Paul et al. | |
| 6,646,511 B1 | 11/2003 | Canyon et al. | |
| 2002/0044018 A1 | 4/2002 | Dupuis et al. | 330/254 |

FOREIGN PATENT DOCUMENTS

| | | | |
|---|---|---|---|
| EP | 399561 | | 11/1990 |
| EP | 0654898 A2 | | 5/1995 |
| GB | 2123231 | * | 1/1984 |
| JP | 03128513 A | | 5/1991 |
| JP | 200174559 | | 6/2000 |
| WO | WO 98/37627 | | 8/1998 |
| WO | WO 00/16492 | | 3/2000 |
| WO | WO 02/23716 | | 3/2002 |

OTHER PUBLICATIONS

Sokal, N. O. and Sokal, A. D., "Class E—A new class of high-efficiency tuned single ended switching power amplifiers," IEEE Journal of Solid State Circuits, vol. SC-10, No. 3, Jun. 1975, pp. 168-176.

Makihara, Chihiro et al., "The Possibility of High Frequency Functional Ceramics Substrate", International Symposium on Mulilayer Electronic Ceramic Devices, May 5, 1998 in Cincinnati, Ohio.

Huange et al., "A BiCMOS /Automatic Gain Control Amplifier for SONET OC-3", Proceeding of the IEEE Custom IC Conference, May 1-4, 1995, pp. 103-106.

Webster, "Websters Ninth New Collegiate Dictionary", Merriam-Webster, 1991, p. 971.

Toffolo et al., "Development of a CMOS switched capacitor instrumentation amplifier", IEEE Colloquium on ASICS, Apr. 10, 1992 p. 2/1.

G. Trauth V. Vanhuffel J. Trichet, "An Advanced Controller For Multi-Band Open Loop Power Control Mode RF Power Amplifier", Microwave Engineering, Jul. 2002, pp. 39-40.

RF Micro Devices, Inc., RF3110 Triple-Band GSM/DCS/PCS Power Amp Module Data Sheet, pp. 2-401-2-412.

* cited by examiner

METHOD AND APPARATUS FOR PROTECTING DEVICES IN AN RF POWER AMPLIFIER

CROSS REFERENCE TO RELATED APPLICATIONS

The following U.S. patent application is expressly incorporated herein by reference: Ser. No. 09/842,456, entitled "RF POWER DETECTOR" by Timothy J. Dupuis et al, filed on Apr. 26, 2001, which is a continuation-in-part of U.S. application Ser. No. 09/660,123, filed on Sep. 12, 2000, entitled "POWER AMPLIFIER CIRCUITRY AND METHOD".

FIELD OF THE INVENTION

This invention relates to the field of power amplifiers. More particularly, this invention relates to circuitry for protecting devices in an RF power amplifier.

BACKGROUND OF THE INVENTION

In some applications utilizing a power amplifier, it is desirable to limit peak voltages to which active devices of the power amplifier are subjected. For example, in CMOS devices, the transistor breakdown voltage may be only slightly greater than the supply voltage. In RF power amplifiers, high peak voltages can be caused by load mismatches, temperature extremes, and device variations, for example. High peak voltages are capable of causing breakdown of the active devices, which can lead to reliability problems.

It can therefore be seen that there is a need for amplifier designs where peak voltages applied to active devices of the amplifier are limited so that the peak voltages are below the transistor breakdown voltages of the devices being used to implement the design.

SUMMARY OF THE INVENTION

An apparatus of the present invention provides a circuit for protecting devices in an RF power amplifier comprising: a peak detector coupled to an output of the power amplifier for detecting peak voltages at the output of the power amplifier; and control circuitry coupled to the peak detector and to the power amplifier for controlling the gain of the power amplifier, wherein the control circuitry decreases the gain of the power amplifier when the peak detector detects a voltage above a voltage threshold.

One embodiment includes a circuit comprising: an RF power amplifier having an input and an output; a peak detector coupled to the power amplifier for detecting a peak voltage at a node of the power amplifier; and power control circuitry coupled to the peak detector and to the power amplifier for controlling the gain of the power amplifier, wherein the power control circuitry limits the power at the output of the power amplifier when the peak detector detects a peak voltage greater than a threshold voltage.

Another embodiment of the invention provides a method of protecting devices in an RF power amplifier comprising the steps of: detecting a peak voltage at a first node of the power amplifier; determining whether the detected peak voltage is higher than a threshold voltage; and if it is determined that the detected peak voltage is higher than the threshold voltage, decreasing the gain of the power amplifier.

Another embodiment of the invention provides a method of controlling an RF power amplifier comprising the steps of: detecting the output power of the RF power amplifier; detecting a peak voltage at a first node of the power amplifier; increasing the gain of the power amplifier if the detected output power is less than a desired output power level and if the detected peak voltage does not exceed a threshold voltage; and decreasing the gain of the power amplifier if the detected output power is greater than the desired output power level or if the detected peak voltage exceeds a threshold voltage.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In order to provide a context for understanding this description, the following illustrates an example of a typical application of the present invention. A power amplifier using the protection techniques of the present invention may be used with a wireless transmission system such as a wireless telephone or other device. In a wireless device such as a cellular telephone, the wireless device may include a transceiver, an antenna duplexer, and an antenna. Connected between the transceiver and the antenna duplexer is an RF power amplifier for amplifying signals for transmission via the antenna. This is one example of an application of a power amplifier utilizing the present invention. Of course, the invention may be used in any other application requiring a power amplifier. In the case of a wireless telephone application, the invention may be applied to GSM, CDMA, PCS, DCS, etc., or other wireless systems.

Figure 1:
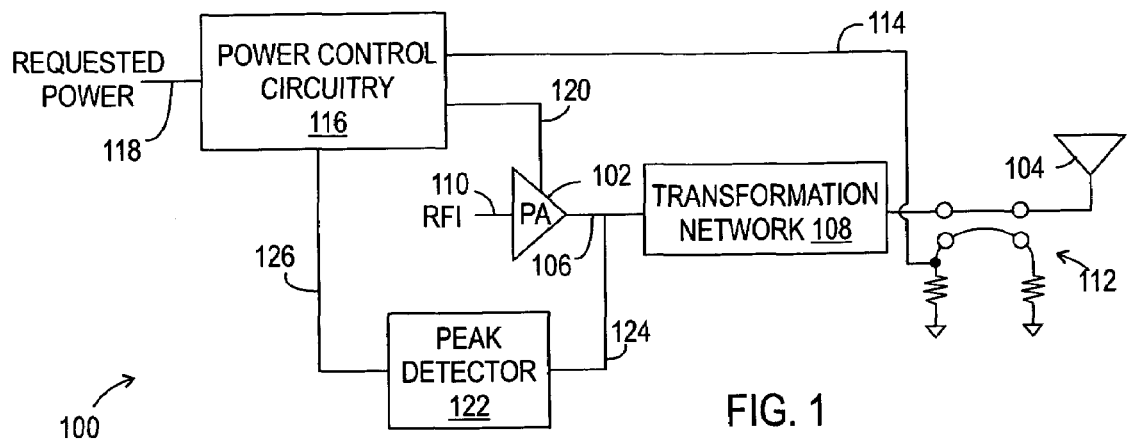
FIG. 1 is a block diagram of a protection circuit of the present invention used with a power amplifier.

FIG. 1 is a block diagram of a protection circuit of the present invention used with a power amplifier. FIG. 1 shows a circuit 100 including a power amplifier 102 and an antenna 104 coupled to the output 106 of the power amplifier 102. A transformation network 108 is connected between the antenna 104 and the output 106 of the power amplifier 102. The input 110 of the power amplifier 102 is connected to an RF input signal RFI.

During operation, the power amplifier 102 amplifies the input signal RFI to achieve a desired output power at the antenna 104. A power detector, such as directional coupler 112, is used to detect the output power. The directional coupler 112 generates an power control signal 114 which is provided to power control circuitry 116. The power control circuitry 116 has a first input 118 for receiving an input signal relating to the requested power (i.e., the desired power level provided to the antenna 104). The desired power level may depend on various factors such that is the physical distance between a cellular phone and a base station (in a cellular phone environment). The power control circuitry 116 generates a control signal 120 which is provided to the power amplifier 102 to control the gain of the power amplifier 102.

As mentioned above, it is desirable to limit the peak voltages applied to active devices of a power amplifier resulting from a load mismatches, temperature extremes, device variations, etc. The present invention utilizes a peak detector 122 to detect the presence of peak voltages at any critical nodes of the power amplifier 102 and create a peak detection signal. An example of one suitable peak detector is described below. In the example shown in FIG. 1, the input 124 of the peak detector 122 is connected to the output 106 of the power amplifier 102. In other examples, the peak detector could be connected to other critical nodes of the power amplifier 102. In addition, the peak detector 122 (or multiple peak detectors) may be connected to multiple nodes of the power amplifier 102 to detect peak voltages at multiple nodes. The output 126 of the peak detector 122 is provided as an input to the power control circuitry 116. The power control circuitry 116 uses the output 126 from the peak detector 122 to control the power amplifier 102 in such a way that dangerous peak voltages are avoided or minimized.

Figure 2:
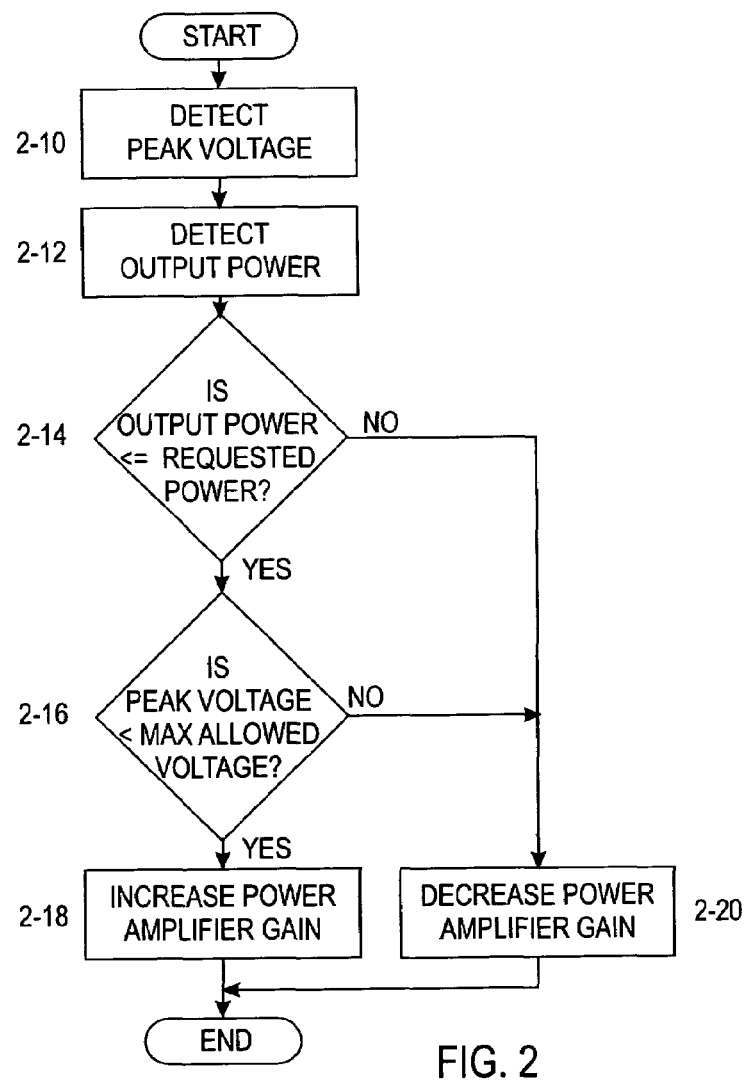
FIG. 2 is a flowchart illustrating the operation of the power control circuitry shown in FIG. 1.

FIG. 2 is a flowchart illustrating the operation of the power control circuitry shown in FIG. 1. As mentioned above, the power control circuitry 116 generates a control signal 120 based on three inputs. These inputs include the desired output power level of the power amplifier 102 (input 118), the actual detected power output level (power control signal 114), and the output of the peak detector 122 (output 126). At step 2–10, the peak voltage is detected by the peak detector 122. Next, at step 2–12, the output power is detected by the directional coupler 112. Note that the order of the steps illustrated in FIG. 2 is not essential to the invention. At step 2–14, it is determined whether the detected output power (step 2–12) is less than or equal to the requested power (as determined by the signal at input 118). If the detected output power is less than or equal to the requested power, the process proceeds to step 2–16 where it is determined whether the detected peak voltage (step 2–10) is less than the a threshold voltage (i.e., a maximum allowed voltage). The maximum allowed voltage can relate to a voltage level that does not adversely affect the active devices of the power amplifier 102, but at the same time is adequate to deliver a suitable output power level to the antenna 104. If the detected peak voltage is less than the maximum allowed voltage, the process proceeds to step 2–18 where the gain of the power amplifier 102 is increased. While FIG. 2 shows the process ending at that point, during use, the process will repeat. If, at step 2–14, it is determined that the detected output power is greater than the requested power, then the process proceeds to step 2–20 where the gain of the power amplifier 102 is decreased. Similarly, if it is determined at step 2–16 that the detected peak voltage is greater than or equal to the maximum allowed voltage, the process proceeds to step 2–20 where the gain of the power amplifier 102 is decreased.

In general, the power control circuitry 116 will adjust the gain of the power amplifier 102 until the output signal power matches the requested power. In the example described, the power control circuitry 116 increases the gain of the power amplifier 102 when the detected output power is less than the desired output power and decreases the gain when the detected output power is greater than the desired output power. However, even if the detected output power is less than the desired output power, the power control circuitry 116 will decrease the gain of the power amplifier 102 (and thereby limiting the power at the output) if the peak detector 122 has detected a peak voltage. In this way, the active devices of the power amplifier 102 are protected from high voltages, which could lead to device breakdown and overall reliability problems. The power control circuitry 116 may implement the algorithm described using analog or digital signal processing using many different techniques well known in control theory.

Figure 3:
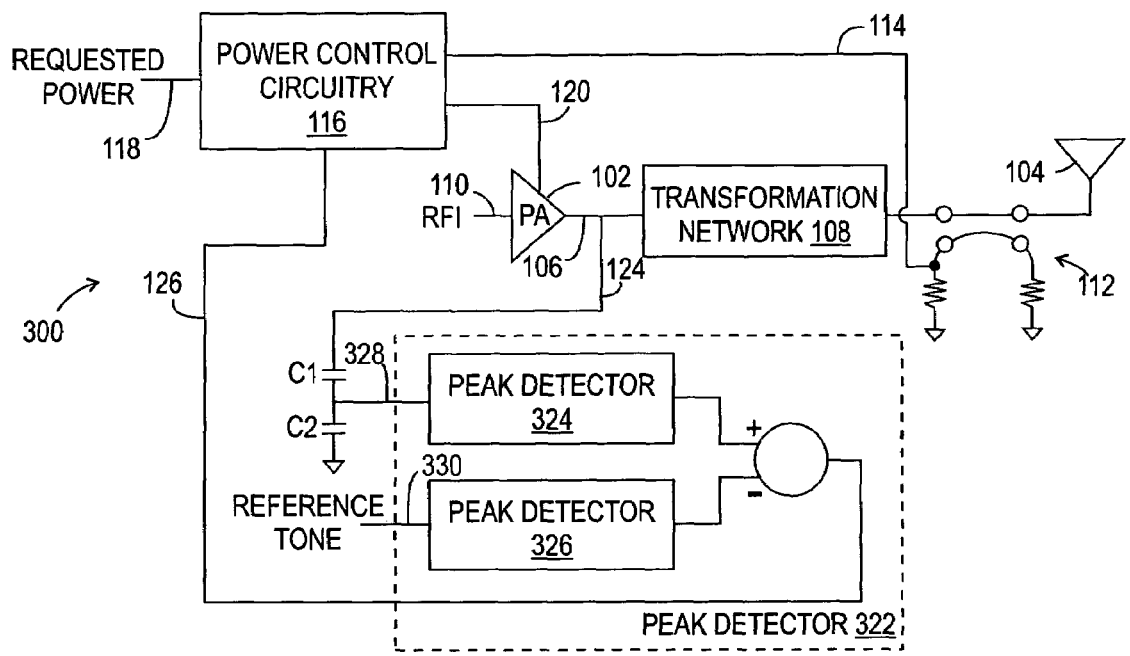
FIG. 3 is a block diagram of a circuit similar to the circuit shown in FIG. 1 illustrating one implementation of a peak detector.

In some implementations, for example, if the invention is implemented using CMOS, the peak detection circuitry can be difficult to design and build with a desired accuracy. FIG. 3 is a block diagram of a circuit similar to the circuit shown in FIG. 1 illustrating one implementation of a peak detector. The circuitry illustrated in the block diagram of FIG. 3 may be used with a non-linear power amplifier and utilizes two simple peak detector circuits. FIG. 3 shows a circuit 300 which includes a power amplifier 102 and an antenna 104 coupled to the output 106 of the power amplifier 102. A transformation network 108 is connected between the antenna 104 and the output 106 of the power amplifier 102. The input 110 of the power amplifier 102 is connected to an RF input signal RFI. A directional coupler 112 generates a power control signal 114 which is provided to power control circuitry 116. The power control circuitry 116 is coupled to the power amplifier 102 and to peak detector 322.

Peak detector 322 is implemented using a first peak detector 324 and a second peak detector 326. The first peak detector 324 has an input 328 which is coupled to the output 106 of the power amplifier 102. In the example shown in FIG. 3, the input 328 is connected to a divider circuit formed by capacitors C1 and C2 connected between the power amplifier output 106 and ground. Of course, other implementations are possible. The peak detector 326 has an input 330, which is coupled to a reference tone. The reference tone may be comprised of a signal having a known amplitude at the carrier frequency. In another example, the reference tone may be comprised of a constant amplitude modulated signal (e.g., the RF input in a GSM system which has a constant amplitude and consists of GMSK modulation). The reference tone may be provided from an existing signal in the device. For example, the reference tone could come from the transmit signal of the power amplifier 102 prior to final stage amplification. In this implementation, the peak detectors 324 and 326 are matched so there are no absolute accuracy requirements on the peak detectors. The output 126 of the peak detector 322 is generated by subtracting the output of the second peak detector 326 from the output of the first peak detector 324. The output 126 provides a peak feedback signal (PFB) represented by the following the equation:

$$PFB = \left[\frac{C_2}{C_1 + C_2}(\text{peak\_RFO}) - (\text{peak\_tone})\right], \quad (1)$$

where "peak$_{13}$ RFO" is the peak voltage of the output of the power amplifier 102 as detected by the first peak detector 324 and "peak_tone" is the peak voltage of the reference tone as detected by the second peak detector 326. If the peak feedback signal FBS at output 126 is positive, then the peak voltage detected by the peak detector 322 is too high.

Otherwise, the peak voltage is satisfactory.

Note that the peak feedback signal at output 126 may be generated using various types of peak detectors. In one example, the peak detectors may be comprised of conventional peak detectors that simply detect the peak voltage of a signal. In another example, where the signal detected is of a known type (such as a sine wave, square wave, etc.), each peak detector may be provided by the combination of an RMS detector followed by a correction circuit. Other examples may include other types of circuits that can detect some function of the waveform that relates to the peak voltage of the waveform.

Figure 4:
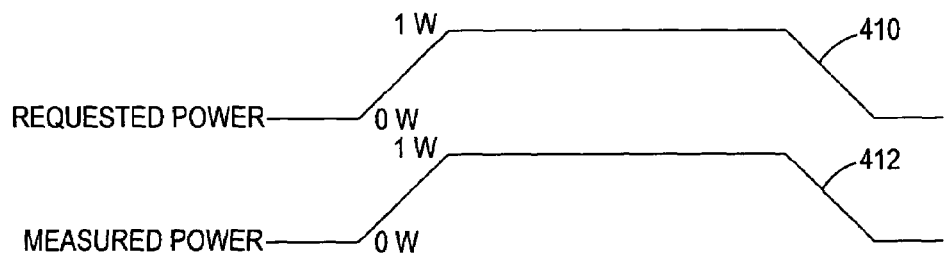
FIGS. 4 and 5 are timing diagrams illustrating the use of the invention in applications where power is ramped.
Figure 5:
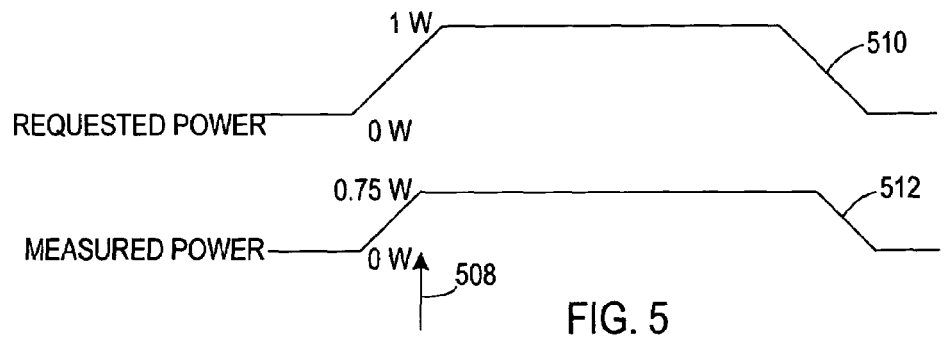

In the case where the invention is used with applications where power is ramped up from zero in a controlled manner, the invention will not allow peak voltages on the output of the power amplifier to get higher than the maximum allowed voltage. This protects the active devices in the power amplifier, while limiting the ability of the power amplifier to deliver power to the load. FIGS. 4 and 5 are timing diagrams illustrating the use of the invention in applications where power is ramped. FIG. 4 shows an example where no peak voltages are detected which exceeds the maximum allowed peak voltage. FIG. 4 shows a first plot 410 which represents the requested power signal at input 118 shown in the Figures. As shown, the plot 410 starts at zero and ramps up until it reaches a desired level (e.g., 1W). A second plot 412 is shown which represents the power measured by the directional coupler. Since no excessive peak voltages were detected in this example, the measured power ramps up and down along with the requested power signal.

FIG. 5 shows an example where a peak voltage is detected that exceeds the maximum allowed peak voltage. The arrow 508 shown in FIG. 5 illustrates the point at which a peak voltage is detected by the peak detector. When the peak voltage is detected, the power control circuitry protects the active devices in the power amplifier by reducing the gain and thus the output power of the power amplifier. In the example shown, the power measured at the output of the power amplifier (plot 512) is reduced to 0.75 Watts.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A circuit for protecting devices in an RF power amplifier comprising:
   a power detector coupled to the output of the RF power amplifier for detecting the output power of the RF power amplifier;
   a peak detector coupled to one or more critical nodes in the RF power amplifier for detecting peak voltages at the one or more critical nodes, wherein the peak detector further comprises a first peak detector having an input coupled to the one or more critical nodes in the RF power amplifier, and a second peak detector having an input coupled to a reference tone;
   a divider circuit coupled between the peak detector and the one or more critical nodes; and
   power control circuitry coupled to the power detector and to the peak detector for controlling the output power of the power amplifier, wherein the power control circuitry protects devices in the RF power amplifier by decreasing the gain of the power amplifier when the peak detector detects a voltage above a voltage threshold at the one or more critical nodes in the RF power amplifier.

2. The circuit of claim 1, wherein outputs of the first and second peak detectors are combined to provide a peak detection signal to the control circuitry.

3. The circuit of claim 2, wherein the first and second peak detectors are matched.

4. The circuit of claim 2, wherein the outputs of the first and second peak detectors are combined by subtracting the output of the second peak detector from the output of the first peak detector.

5. The circuit of claim 2, further comprising a divider circuit coupled between the first peak detector and the output of the power amplifier.

6. The circuit of claim 5, wherein the divider is comprised of a first and second capacitor coupled between the output of the power amplifier and ground.

7. The circuit of claim 1, further comprising a power detector coupled to the output of the power amplifier and to the control circuitry for detecting the output power of the power amplifier.

8. The circuit of claim 1, wherein the peak detector detects peak voltages present across one or more transistors in the RF power amplifier.

9. The circuit of claim 1, wherein the peak detector detects peak voltages present across one or more switching devices in the RF power amplifier.

10. The circuit of claim 1, wherein the one or more critical nodes do not include the output of the power amplifier.

11. The circuit of claim 1, wherein the divider circuit is a capacitive divider circuit.

12. The circuit of claim 1, wherein the divider circuit divides the voltage detected at the one or more critical nodes; and wherein the input of the peak detector is coupled to the divided voltage.

13. A circuit comprising:
    an RF power amplifier having an input and an output;
    a power detector coupled to the output of the RF power amplifier for detecting the output power of the RF power amplifier;
    a peak detector coupled to the power amplifier for detecting a peak voltage at a node of the power amplifier, wherein the node is a node other than the output of the power amplifier, wherein the peak detector is comprised of first and second matched peak detectors; and
    power control circuitry coupled to the peak detector and to the power amplifier for controlling the gain of the power amplifier, wherein the power control circuitry limits the power at the output of the power amplifier when the peak detector detects a peak voltage greater than a threshold voltage.

14. The circuit of claim 13, wherein the first peak detector is coupled to the output of the power amplifier and the second peak detector is coupled to a reference tone.

15. The circuit of claim 14, wherein the first and second peak detectors are matched.

16. The circuit of claim 13, further comprising a power detector coupled to the output of the power amplifier and to the power control circuitry for detecting the output power of the power amplifier.

17. The circuit of claim 13, further comprising a divider circuit coupled between the peak detector and the node of the power amplifier.

18. A circuit for protecting devices in an RF power amplifier comprising:

a power detector coupled to the output of the RF power amplifier for detecting the output power of the RF power amplifier;

a peak detector coupled to one or more critical nodes in the RF power amplifier for detecting peak voltages at the one or more critical nodes, wherein the peak detector further comprises a first peak detector having an input coupled to the one or more critical nodes in the RF power amplifier, and a second peak detector having an input coupled to a reference tone; and power control circuitry coupled to the power detector and to the peak detector for controlling the output power of the power amplifier, wherein the power control circuitry protects devices in the RF power amplifier by decreasing the gain of the power amplifier when the peak detector detects a voltage above a voltage threshold at the one or more critical nodes in the RF power amplifier.

19. The circuit of claim 18, wherein outputs of the first and second peak detectors are combined to provide a peak detection signal to the control circuitry.

20. The circuit of claim 19, wherein the first and second peak detectors are matched.

21. The circuit of claim 19, wherein the outputs of the first and second peak detectors are combined by subtracting the output of the second peak detector from the output of the first peak detector.

22. The circuit of claim 19, further comprising a divider circuit coupled between the first peak detector and the output of the power amplifier.

23. The circuit of claim 22, wherein the divider is comprised of a first and second capacitor coupled between the output of the power amplifier and ground.

* * * * *

UNITED STATES PATENT AND TRADEMARK OFFICE
CERTIFICATE OF CORRECTION

| | | |
|---|---|---|
| PATENT NO. | : 7,145,396 B2 | Page 1 of 1 |
| APPLICATION NO. | : 10/673750 | |
| DATED | : December 5, 2006 | |
| INVENTOR(S) | : Timothy J. Dupuis | |

It is certified that error appears in the above-identified patent and that said Letters Patent is hereby corrected as shown below:

In the Specification

<u>COL. 1, Line 8</u>:
ADD before The --This application is a continuation of Serial No. 09/932,817, entitled "METHOD AND APPARATUS FOR PROTECTING DEVICES IN AN RF POWER AMPLIFIER" by Timothy J. Dupuis et al., filed on August 17, 2001.--

Signed and Sealed this
Twenty-second Day of July, 2014

Michelle K. Lee
*Deputy Director of the United States Patent and Trademark Office*